United States Patent [19]

Thompson

[11] Patent Number: 4,632,557

[45] Date of Patent: Dec. 30, 1986

[54] ALIGNMENT TARGET IMAGE ENHANCEMENT FOR MICROLITHOGRAPHY PROCESS

[75] Inventor: Thomas K. Thompson, Palm Bay, Fla.

[73] Assignee: Harris Corporation, Melbourne, Fla.

[21] Appl. No.: 694,096

[22] Filed: Jan. 23, 1985

[51] Int. Cl.[4] .............................................. G01B 11/27
[52] U.S. Cl. .................................................... 356/401
[58] Field of Search ......................... 356/399, 400, 401

[56] References Cited

U.S. PATENT DOCUMENTS

| | | |
|---|---|---|
| 3,199,114 | 8/1965 | Malifaud . |
| 3,652,370 | 3/1972 | Motai . |
| 4,013,465 | 3/1977 | Clapham et al. ................ 350/276 R |
| 4,103,998 | 8/1978 | Nakazzwa et al. ................. 356/152 |
| 4,114,983 | 9/1978 | Maffitt et al. .................... 350/276 R |
| 4,200,395 | 4/1980 | Smith et al. ........................... 356/400 |
| 4,211,489 | 7/1980 | Kleinknecht et al. ............... 356/400 |
| 4,356,223 | 10/1982 | Iida et al. .............................. 356/401 |
| 4,379,180 | 4/1983 | Baglin et al. ........................... 427/38 |
| 4,390,279 | 6/1983 | Suwa .................................... 356/401 |

Primary Examiner—R. A. Rosenberger
Attorney, Agent, or Firm—Barnes & Thornburg

[57] ABSTRACT

A reflective target region is surrounded by a substantial light scattering region on a substrate to increase the contrast. The width of any reflective portion of the light scattering region is substantially smaller than the width of the target region along the orthogonal axis of the substrate. The light scattering region includes a plurality of peaks and valleys having parallel axis which are oblique to the axis of the substrate.

9 Claims, 6 Drawing Figures

ALIGNMENT TARGET IMAGE ENHANCEMENT FOR MICROLITHOGRAPHY PROCESS

BACKGROUND AND SUMMARY OF THE INVENTION

The present invention relates generally to alignment targets and more specifically to an alignment target having enhanced contrast.

Alignment targets generally used in integrated circuit fabrication generally include a series of indicia on the surface or subsurface of a substrate which are used to align masking patterns for photolithographic machinery. The alignment target is used for not only locating a particular position on the wafer, but is also used to align the wafer in two axes. The degree of accuracy of the alignment is a function of the resolution of the optical system. Similarly, lack of contrast between the alignment indicia or target does effect the accuracy and resolution.

One solution to the resolution is not to use a direct optical reading, but to use diffraction patterns as illustrated in U.S. Pat. Nos. 4,200,395 and 4,211,489.

Recognition of the problem of low target to background contrast is recognized by U.S. Pat. Nos. 4,103,998 and 4,390,279. The first patent solves this problem by using coherent light. In the second patent, the solution is to use a unique optical system to receive specific reflected light from the target.

Thus, there exists a need for a direct optical reading system of improved contrast.

It is an object of the present invention to provide an enhanced contrast alignment target for use in integrated circuits.

Another object of the present invention is to provide an alignment target of improved contrast for use in a digital optical system.

These and other objects of the invention are attained by providing an optical target which includes a highly reflective target region surrounded by a substantial contrast region having light scattering characteristics. The contrast region generally includes a plurality of hills and valleys having parallel axis with a mimimum of flat reflective area. Preferably, the parallel axis of the peaks and valleys are oblique to the scanning axis of the automatic optical system. Any flat area of the contrast region is substantially small along the scanning axis compared to the width of the target region along the scanning axis.

Other objects, advantages and novel features of the present invention will become apparent from the following detailed description of the invention when considered in conjunction with the accompanying drawings.

DETAILED DESCRIPTION OF THE DRAWINGS

Figure 1:
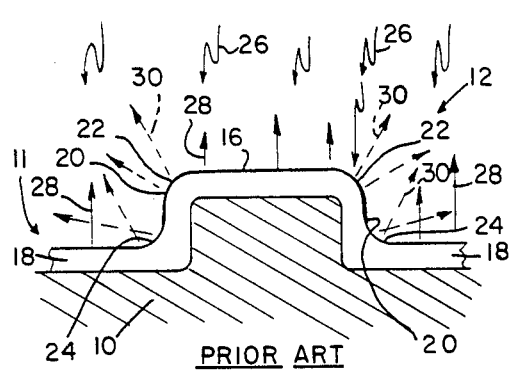
FIG. 1 is a cross-sectional view of an alignment target of the prior art.
Figure 2:
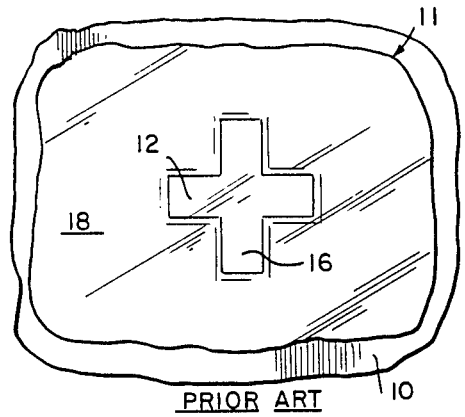
FIG. 2 is a plan view of an alignment target of the prior art of FIG. 1.

FIGS. 1 and 2 illustrate a target of the prior art having a cross or T-shaped target 12 in a target area 11 on a substrate 10. As illustrated in FIG. 1, the target 12 is a raised portion compared to the target area 11. In photolithographic processing, a material layer 18 for example, photoresist, is applied over the substrate to be patterned. The alignment target 12 is used to align the optical system relative to the substrate. The substrate is a wafer generally having a physical means to align the wafer axis relative to the axis of the optical or processing system. This generally includes a vertical flat for mounting the wafer into the machine or apparatus. This flat is not shown but is well known in the art. The application of the reflective material or layer 18 includes flat reflective portions 16 and 18 on the target 12 and the target area 11 respectively. A vertical portion 20 is connected to flat 16 by curve portion 22 and to flat 18 by curve portion 24.

As can be seen in FIG. 1, the radiation rays 26 produces reflective rays 28 off flat surfaces 16 and 18 which are received and detected by the optical system. The rays 26 also produces reflected rays 30 off surfaces 20, 22 and 24 at an angle relative to the axis of the incoming rays 26. The reflective rays 30 off vertical surface 20 are at an angle such that they are not received by the optical system, whereas the reflective rays off of curved surfaces 22 and 24 may be partially received by the optical system. As can be seen, the width of the slope region 20, 22 and 24 is substantially smaller than the width of the flat 16 and flat 18. Thus, there is no substantial contrast between the target indicia 12 and the target area 11. This lack of contrast as discussed above is a well known problem in the prior art and substantially effects the resolution and accuracy.

Figure 3:
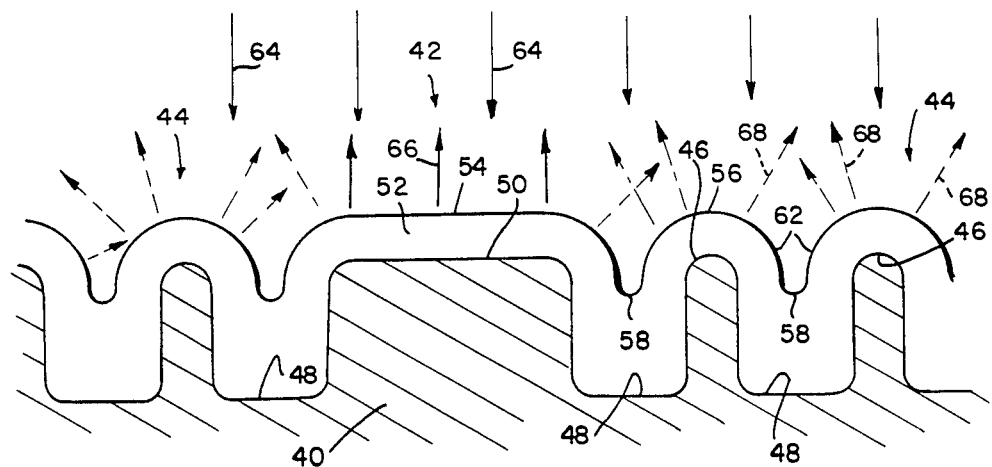
FIG. 3 is a cross-sectional view of an alignment target incorporating the principles of the present invention.
Figure 4:
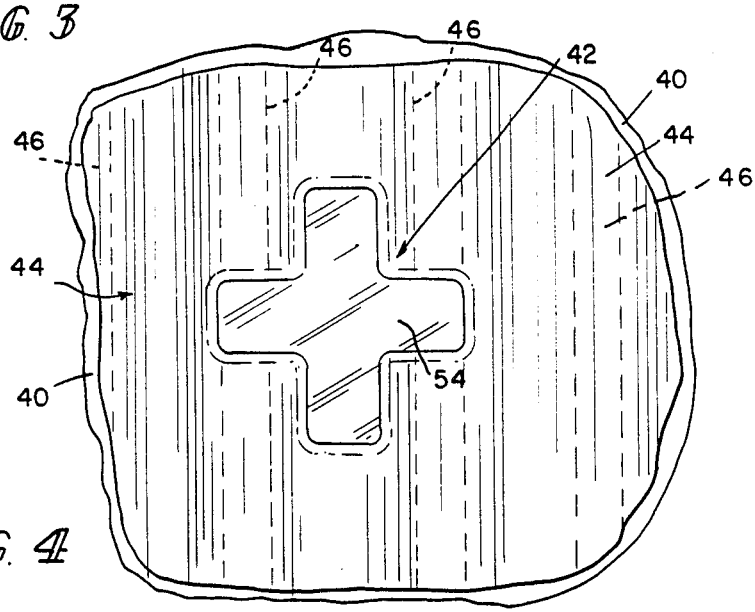
FIG. 4 is a plan view of an alignment target incorporating the principles of the present invention.

An enhanced target, as illustrated in FIGS. 3 and 4, includes a target indicia 42 having a highly reflective region or area surrounded by a contiguous region 44 of light scattering characteristics on a substrate 40. As illustrated specifically in FIG. 3, the contrast region 44 includes a plurality of peaks 46 separated from each other by a plurality of valleys 48 as well as from the flat 50 of target area 42 by the valleys 48. A material to be patterned for example, a photoresist layer 52, is applied over the substrate producing a flat 54 over the target region 42 surrounded by peaks 56 and valleys 58. It should be noted that depending upon the method of application of the reflective layer 52, the sharpness of the peaks and valleys 46 and 48 are softened by the layer 52 such that the heights of the peaks and valleys 56 and 58 and the slope of the portion 62 between the peaks 56 and 54 in the valleys 58 is lessened. Thus, the width of the flat portion of the valley 58 is substantially smaller than the width of the valley flat 48.

The incident radiation 64 reflects back in the same direction off flat 54 as shown by rays 66. The reflection off of the peaks, valleys and slopes 56, 58 and 62 as illustrated by rays 68 are non-parallel to the axis of the incident rays 64. Thus, only the flat 54 produces reflected rays 66 and the peaks, valleys and slopes 56, 58 and 62 produce scattered rays 68. This enhances the contrast between the target 42 and the lateral area 44 about the target 42.

The peaks 46 and the valleys 48 may be a series of parallel axis ridges 46 and parallel axis valleys 48. Alternatively, the peaks and valleys 46 and 48 may be random peaks and valleys. The important criteria is that the flat portion of the peaks and valleys on the reflective layer 52 namely, regions 56, 58 and 62, have substantially smaller width than the width of the flat reflective surface 54 of the target 42. The height differential between the peaks 46 and the valleys 48 as well as their width are selected so as to minimize any flat portion in the resulting reflective layer 52.

If the scattering contrast region 44 is not random peaks and valleys, parallel ridge and valley lines are formed. These parallel peak and valley lines provide flat surfaces which would produce reflective rays which must be distinguishable from the flat of the target pattern especially in optical systems using digital analysis. In digital optical systems, the video signals produced by the optical sensor or a television camera are converted into generally 256 different digital values representing the average video amplitude of each line of pixels across the target field. There are 256 lines in the horizontal direction of scanning and 256 lines in the vertical direction of scanning. When using horizontal or vertical parallel axis of the peaks and valleys to produce the light scattering pattern region 44, the scan may take place across one of these peaks or valleys parallel lines and the system may detect a change in video amplitude and, thus, the system will interpret this as part of the alignment target.

Figure 5:
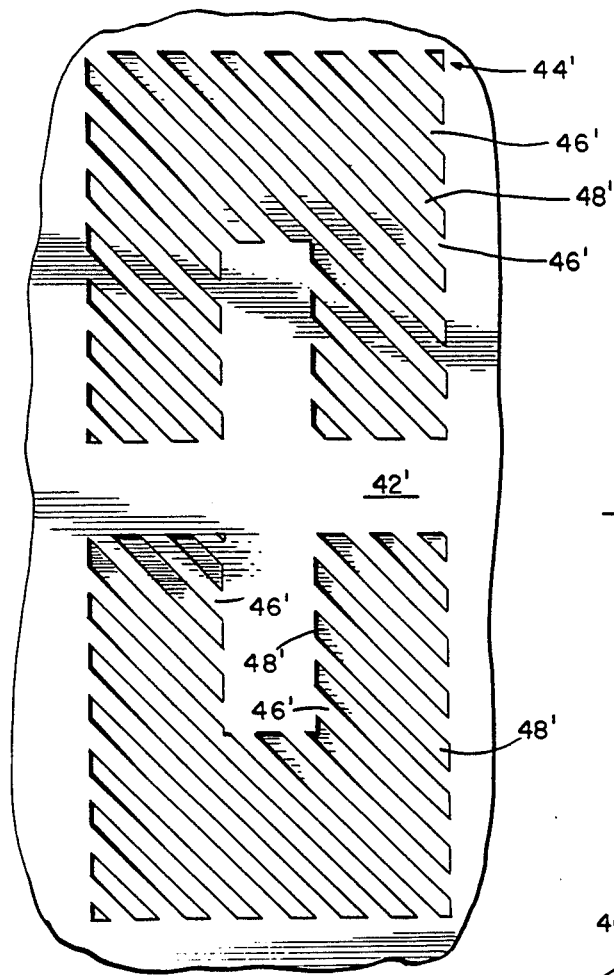
FIG. 5 is a plan view of another alignment target incorporating the principles of the present invention.
Figure 6:
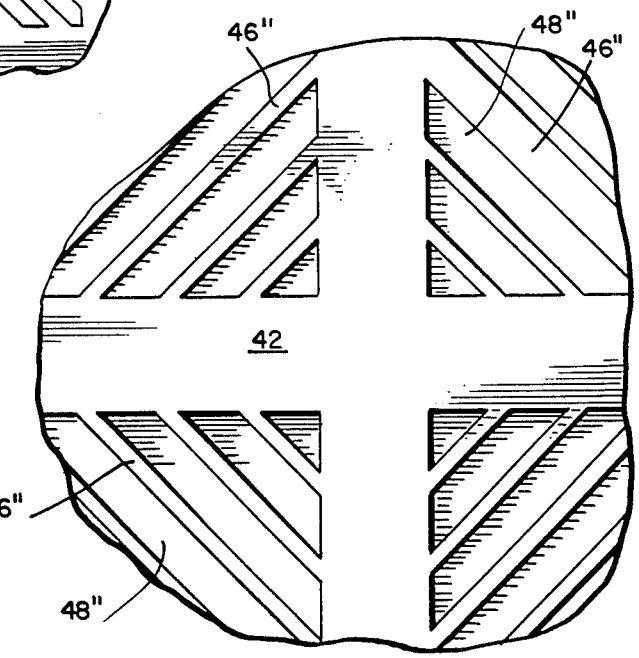
FIG. 6 is a partial plan view of even another alignment target incorporating the principles of the present invention.

To prevent this occurrence and possible error, it is recommended as illustrated in FIG. 5 that the peaks and valleys be provided to have an axis oblique to the scanning axis of the digital optical system. The target 42 is in a scattering area 44' having peak ridges 46' and valleys 48' formed at an angle oblique to the axis of the target 42. As previously discussed, the wafer or substrate generally has a flat to align the wafer in the optical scanning system so as to define the horizontal and vertical axis of the wafer. Thus, the formation of the parallel axis of the ridges 46' and the valleys 48' can be defined oblique to the axis of the wafer relative to the flat. As illustrated in FIG. 6, the ridges 46" and valleys 48" can be parallel to each other in a given quadrant and still be oblique to the axis of the wafer.

By using the diagonal lines to produce the light scattering pattern, the average video amplitude will stay roughly the same until the actual target edge is determined because no gap in lines will be significantly broad enough to reduce the average video amplitude. This assures that a horizontal or vertical scanning sequence will not ride along a flat which generally runs along the parallel axis of the ridges or valleys. Since the relative thickness of any flat of the ridges or valleys is small compared to the target indicia 42, they may be readily distinguished.

It should be noted that although the target 42 is illustrated as being a cross or T having a horizontal and vertical axis parallel to the horizontal and vertical axis of the substrate, its relative thickness can also be detected if the axis of the target 42 is at an oblique angle relative to the horizontal and vertical axis of the wafer or substrate. Thus, if the target 42 is rotated 45° such as to become an "X", the horizontal and vertical scanning would cross a substantial width flat, thus it would be distinguishable from the flats of the ridges and valleys 46' and 48'. It should also be noted that other types of targets 42 may be used other than a cross or T as long as it has substantial flat areas compared to the flats of the contrast region 44'. The difference of the reflective characteristics of the target 42 and the light scattering area 44' provides a differing contrast and are not related to produce a visual diffraction pattern which is used for alignment.

Although the targets 42 has been illustrated as a raised portion relative to the surface of the substrate, it may be a flat recess portion separated from the light scattering portion 44 by a peak instead of a valley.

The processes of forming the raised or lowered portion are well within the skill of the art including forming a mask, etching and removing the mask material to form the flat 52, the peaks 46 and the valleys 48. An example of the physical measurements of a mask made according to FIGS. 3 through 6 would include a target 42 having the width of flat 50 of approximately 8 microns, valley 48 having a flat or width of approximately 3 microns and a depth of approximately 2 microns. The width of the peak 46 would be approximately 1 micron.

From the preceding description of the preferred embodiments, it is evident that the objects of the invention are attained, and although the invention has been described and illustrated in detail, it is to be clearly understood that the same is by way of illustration and example only and is not to be taken by way of limitation. The spirit and scope of the invention are to be limited only by the terms of the appended claims.

What is claimed is:

1. An alignment target comprising:
   a substrate;
   a flat target region of a light reflecting characteristic on said substrate; and
   a contrast region of a plurality of peaks and valleys contiguous to said target region of a light scattering characteristic on said substrate;
   the lateral area of said contrast region being substantially greater than the lateral area of said target region to enhance the contrast of said target region.

2. An alignment target according to claim 1 wherein said target and contrast regions are made of the same material.

3. An alignment target according to claim 2 wherein said peaks and valleys are each shaped to have an axis which are parallel to each other, said target region includes a first and second portion having orthogonal axes, and said peaks' and valleys' axes are oblique to said orthogonal axes.

4. An alignment target according to claim 2 wherein the width of any flat portion of each of said peaks and valleys are substantially smaller than the width of said flat target region.

5. An alignment target according to claim 1 wherein said target region is shaped to have a major axis and said peaks and valleys are shaped each to include an axis which is oblique to said target region's major axis.

6. An alignment target according to claim 1 wherein the depth of the valley is at least as great as the separation of said ridges.

7. An alignment target according to claim 6 wherein the width of each of said ridges and valleys are less than the width of said target region.

8. An alignment target according to claim 1 wherein said substrate includes means for defining orthogonal axes of said substrate and said peaks and valleys are shaped to each include an axis which is oblique to said substrate's axes.

9. An alignment target according to claim 8 wherein the width of said target region along said substrate's orthogonal axes is substantially greater than the width of any reflective portion of said peaks or valleys along said substrate's orthogonal axes.

* * * * *